(12) United States Patent
Grabmaier

(10) Patent No.: US 9,499,398 B2
(45) Date of Patent: Nov. 22, 2016

(54) VERTICALLY HYBRIDLY INTEGRATED ASSEMBLY HAVING AN INTERPOSER FOR STRESS-DECOUPLING OF A MEMS STRUCTURE, AND METHOD FOR ITS MANUFACTURE

(71) Applicant: Robert Bosch GmbH, Stuttgart (DE)

(72) Inventor: Florian Grabmaier, Tuebingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/735,891

(22) Filed: Jun. 10, 2015

(65) Prior Publication Data

US 2015/0360935 A1   Dec. 17, 2015

(30) Foreign Application Priority Data

Jun. 12, 2014   (DE) .................. 10 2014 211 188

(51) Int. Cl.
| | |
|---|---|
| *H01L 23/48* | (2006.01) |
| *H01L 21/768* | (2006.01) |
| *B81B 7/00* | (2006.01) |
| *B81C 1/00* | (2006.01) |

(52) U.S. Cl.
CPC ... *B81C 1/00238* (2013.01); *B81C 2203/0792* (2013.01)

(58) Field of Classification Search
CPC .................. H01L 29/84; H01L 21/768; H01L 23/48; H01L 21/76898; H01L 23/481; B81C 1/00; B81C 1/00301; B81C 1/00134; B81B 7/00; B81B 7/007; B81B 3/0018

See application file for complete search history.

(56) References Cited

U.S. PATENT DOCUMENTS

| | | | | |
|---|---|---|---|---|
| 2009/0232336 | A1* | 9/2009 | Pahl .................. | H04R 1/04 381/175 |
| 2010/0007016 | A1* | 1/2010 | Oppermann ......... | H01L 21/486 257/737 |
| 2010/0192689 | A1* | 8/2010 | Ulm .................... | B81B 7/0012 73/430 |
| 2010/0232119 | A1* | 9/2010 | Schmidt ............... | B81C 1/0023 361/746 |
| 2013/0270660 | A1* | 10/2013 | Bryzek ................ | H01L 29/84 257/418 |

(Continued)

*Primary Examiner* — Fazli Erdem
(74) *Attorney, Agent, or Firm* — Norton Rose Fulbright US LLP; Gerard Messina

(57) ABSTRACT

A structural concept for a vertically hybridly integrated assembly having at least one MEMS component is provided, whose MEMS structure is developed at least partially in the front side of the component and which is electrically contactable via at least one connection pad on the front side of the component. This structural concept is able to be realized in an uncomplicated and cost-effective manner and allows the largely stress-free mounting of the MEMS structure within the chip stack and also ensures a reliable electrical linkage of the MEMS component to further component parts of the assembly. For this purpose, the structural concept provides for mounting the MEMS assembly headfirst on a further component of the chip stack via an interposer and for electrically linking it to the further component via at least one plated contacting in the interposer.

19 Claims, 1 Drawing Sheet

(56) References Cited

U.S. PATENT DOCUMENTS

2013/0277774 A1* 10/2013 Frey .................. B81B 7/007
                                                          257/415
2015/0128703 A1*  5/2015 Kaelberer ........... G01P 15/0802
                                                          73/514.01

* cited by examiner

VERTICALLY HYBRIDLY INTEGRATED ASSEMBLY HAVING AN INTERPOSER FOR STRESS-DECOUPLING OF A MEMS STRUCTURE, AND METHOD FOR ITS MANUFACTURE

FIELD OF THE INVENTION

The present invention relates to a structural concept for a vertically hybridly integrated assembly in the form of a chip stack having a MEMS component, whose MEMS structure is at least partially developed in the front side of the component and electrically contactable via at least one connection pad on the front side of the component. The structural concept is meant to allow a largely stress-free mounting of the MEMS structure within the chip stack.

BACKGROUND INFORMATION

One preferred use for said structural concept is the realization of sensor components, e.g., for sensing accelerations, rates of rotation, magnetic fields, or pressures as well. These measured quantities are acquired with the aid of the MEMS component and converted into electrical signals. In most cases the sensor component then also includes at least one ASIC component for processing and analyzing the measuring signals. Such components can be used for a wide variety of applications, such as in the automotive and consumer fields. Component miniaturization providing high functionality integration is of particular importance. Because no repackaging of the chips is carried out, vertically hybridly integrated components prove especially advantageous in this context. Instead, within the scope of the second-level assembly the chip stack is mounted directly on an application circuit board in the form of what is generally known as a chip-scale package.

If possible, the MEMS component should be integrated into the chip stack of a vertically hybridly integrated component in such a way that the MEMS structure is protected from environmental influences that interfere with the sensor functionality. This applies in particular to sensitive MEMS structures, such as the diaphragm of a pressure-sensor component. When setting up the chip stack, attention must also be paid that no mechanical tensions that stem from the assembly and falsify the measuring signal are introduced into the MEMS structure. In addition, the electrical contacting of the individual components must be ensured.

SUMMARY

The present invention proposes a structural concept that is able to be realized in a simple and cost-effective manner and allows the largely stress-free mounting of the MEMS structure within the chip stack of a vertically hybridly integrated assembly, and also ensures reliable electrical linking of the MEMS component to further component parts of the assembly.

To do so, in the structural concept according to the present invention the MEMS component is mounted headfirst on a further component of the chip stack via an interposer, and is electrically linked to the further component by way of at least one plated contacting in the interposer. According to the present invention, the plated contacting is realized in the form of a metal-filled plated contacting opening, the metal filling of the plated contacting being grown on the connection pad of the MEMS component and extending through the entire interposer.

According to the manufacturing method of the present invention, an interposer is structured, and at least one plated contacting opening, which extends from the front side to the rear side of the interposer, is created in the process. Prior to the filling of the plated contacting opening, the interposer is mechanically connected to the component front side of the MEMS component, so that a space remains between the MEMS structure and the interposer. The plated contacting opening in the interposer is situated in alignment with the connection pad on the component front side of the MEMS component. Only then will the at least partial galvanic filling of the plated contacting opening with a metallic material take place, so that the metallic material grows on the connection pad of the MEMS component as well. This configuration—MEMS component together with interposer—is then mounted via the interposer on a further component.

Because of the headfirst mounting of the MEMS component, the sensitive MEMS structure in the component front side is protected from harmful environmental influences, such as damage or contamination. In order to minimize the mounting-related stress acting on the MEMS structure, the MEMS component is not mounted directly on the further component using flip chip technology, but rather via a stress-decoupled interposer, which is connected to the front side of the component outside the region of the MEMS structure only. The electrical contacting of the MEMS component is realized via plated contactings in the interposer, which are likewise situated outside the region of the MEMS structure. The plated contactings are implemented in the form of metal-filled plated contacting openings. In the present invention, this metal layer is applied only after the MEMS component and the interposer have been connected. The electrical linkage between the MEMS component and the plated contacting in the interposer is produced in this step as well, in that the metal layer of the plated contacting is grown directly on a connection pad on the front side of the MEMS component.

In one especially advantageous variant of the manufacturing method according to the present invention, the metallization process with the aid of which bumps for the assembly on a further component on the rear side of the interposer are usually created is used for this purpose. As a rule, this is a galvanic process. In this method variant, the bumps thus are not built up on a connection pad on the rear side of the interposer; instead, they grow as metal pillars which are grown on the connection pads of the MEMS component, through the plated contacting openings in the interposer and end in a bump on the rear side of the interposer. That is to say, the plated contactings in the interposer are produced in one process step, together with the mounting bumps, which is extremely efficient and cost-advantageous.

If possible, the interposer should be produced from a material that is adapted to the material of the MEMS component in terms of its thermal coefficient of expansion and which is able to be patterned in an uncomplicated manner. In case of a MEMS component based on silicon, interposers made of glass, silicon or ceramics are especially suitable.

The mechanical connection between the MEMS component and the interposer may be produced in an especially cost-effective manner in a gluing step. However, bonding methods such as eutectic bonding are also usable for this purpose.

DETAILED DESCRIPTION

Figure 1:
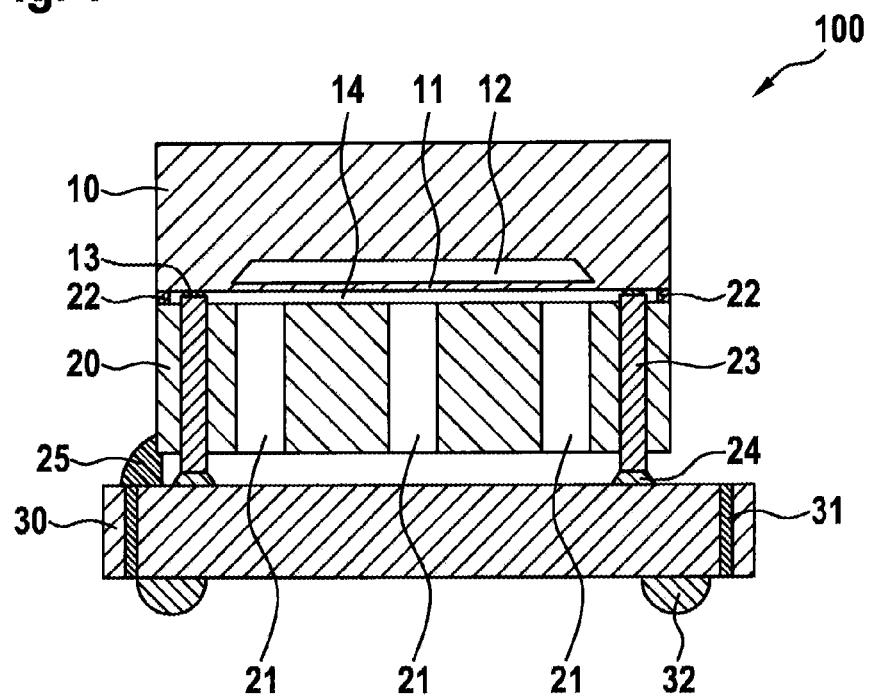
FIG. 1 shows a schematic sectional view of a vertically hybridly integrated assembly 100, in which the structural concept according to the present invention was realized.

Assembly 100 shown in FIG. 1 is developed in the form of a chip stack and includes a MEMS component 10, which is mounted via an interposer 20 on a further component 30, which is an ASIC component in this particular case. Since both components 10 and 30 are silicon chips, a glass, silicon or ceramics substrate is used as interposer 20.

In the exemplary embodiment at hand, MEMS component 10 serves as pressure sensor element. Here, the MEMS structure is spanned by a sensor diaphragm 11 on the front side of the component, which covers a cavity 12. The deflections of sensor diaphragm 11, for example, are acquired with the aid of piezo resistors in the diaphragm region and converted into electrical signals. The electrical contacting of MEMS component 10 takes place via connection pads 13 on the front side of the component, which are disposed along the side of sensor diaphragm 11.

Sensor diaphragm 11 is acted upon by the measuring pressure via plated contacting openings 21 in interposer 20. These pressure connection openings 21 are developed in the center region of interposer 20 underneath sensor diaphragm 11. Interposer 20 is connected to MEMS component 10 only outside the diaphragm region, i.e., via a circumferential adhesive connection 22 and via plated contactings 23 in the region of MEMS connection pads 13. These plated contactings 23 are realized in the form of a metal filling of plated contacting openings and extend across the entire thickness of interposer 20. The metallic filling material may be copper, for instance. It is grown on MEMS connection pads 13 and forms bumps 24 on the rear side of interposer 20. This filling was produced in a galvanic manner in a plating process usually employed for producing flip-chip bumps.

Accordingly, bumps 24 were also used for mounting the interposer-MEMS structure on ASIC component 30. Not only was a mechanical connection produced in the process, but an electrical contacting established as well. Via this electrical connection, i.e., via plated contactings 23 in interposer 20, the measuring signals of MEMS component 10 are transmitted to ASIC component 30, which is provided with switching means for processing and analyzing the measuring signals.

In the exemplary embodiment illustrated here, the mechanical connection between interposer 20 and ASIC component 30 was at least regionally sealed as well. An epoxy resin 25, for instance, may be used for this purpose, which is adapted to the material properties and, in particular, the thermal coefficient of expansion of interposer 20 and ASIC component 30.

The second level mounting of assembly 100 on an application circuit board takes place via the rear side of ASIC component 30, with the aid of solder balls 32. For this purpose, the sensor signals are routed to the rear side via plated contactings 31 in ASIC component 30.

Figure 2:
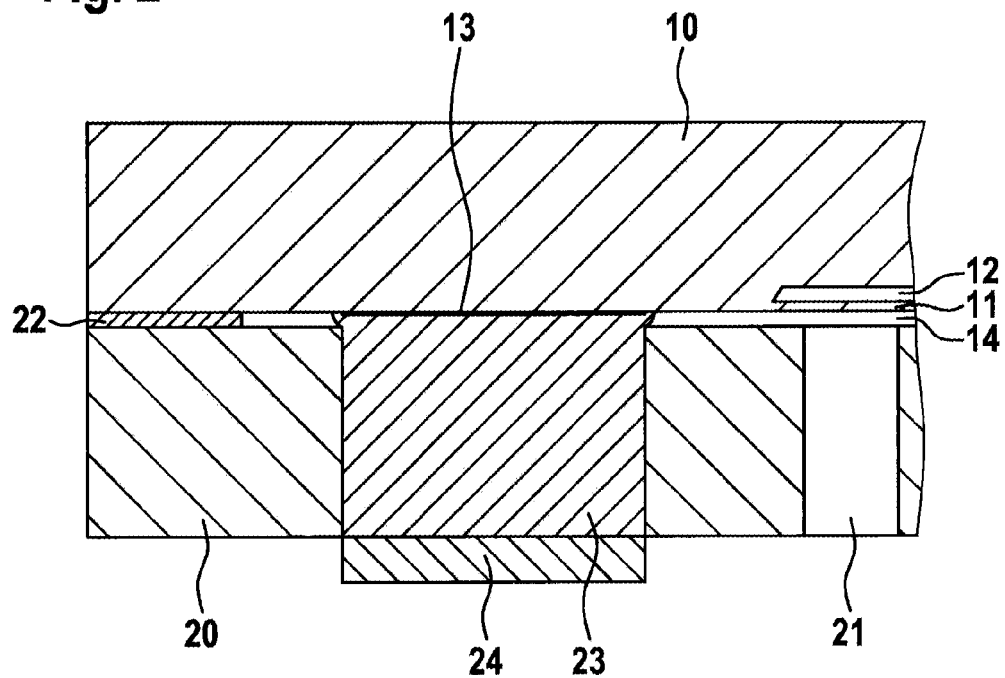
FIG. 2 shows a detail view of the connection region between MEMS component 10 and interposer 20 of this assembly 100 in the region of a plated contacting 23.

FIG. 2 once again illustrates the linkage of plated contactings 23 in interposer 20 to connection pads 13 of MEMS component 10 according to the present invention. The metallic filling material of plated contactings 23 has been grown directly on these connection pads 13. In addition, FIG. 2 illustrates that the stress-sensitive diaphragm region of MEMS component 10 is stress-decoupled for the most part. On the one hand, this is attributable to clearance 14 between MEMS component 10 and interposer 20 in the diaphragm region and, for another, to the fact that both the adhesive connection 22 between MEMS component 10 and interposer 20 as well as plated contactings 23 are clearly disposed outside the stress-sensitive diaphragm region.

It is finally also pointed out that the structural concept according to the present invention for vertically hybridly integrated assemblies is not restricted to the realization of pressure-sensor components, but may basically also be used for the mechanical decoupling of any stress-sensitive MEMS structures in a chip stack.

What is claimed is:

1. A method for manufacturing a vertically hybridly integrated assembly having at least one MEMS component with a MEMS structure that is at least partially developed in a front side of the MEMS component and that is electrically contactable via at least one connection pad on the front side of the MEMS component, the method comprising:
    producing at least one plated contacting opening in an interposer, the plated contacting opening extending from a front side of the interposer to a rear side of the interposer;
    mechanically connecting the interposer to the front side of the MEMS component, so that a space remains between the MEMS structure and the interposer, the plated contacting opening in the interposer being situated in alignment with the connection pad on the front side of the MEMS component;
    after mechanically connecting the interposer to the MEMS component, at least partially galvanically filling the plated contacting opening of the interposer with a metallic material, so that the metallic material grows on the connection pad of the MEMS component as well; and
    after galvanically filling the plated contacting opening, mounting the MEMS component via the interposer on a further component.

2. The method as recited in claim 1, wherein the interposer is at least one of: glued to the front side of the MEMS component, or bonded to the front side of the MEMS component.

3. The method as recited in claim 1, wherein:
    the galvanic process for filling the plated contacting opening creates at least one bump on the rear side of the interposer, the bump sealing the plated contacting, and
    the mounting of the MEMS component via the interposer to the further component connects the bump to the further component.

4. The method as recited in claim 3, wherein the bump provides an electrical connection between the MEMS component and the further component to transmit signals generated by the MEMS component to the further component.

5. The method as recited in claim 1, wherein the MEMS structure and the connection pad are developed in a front side of a silicon substrate of the MEMS component, and the mechanical connecting connects the interposer to the front side of the silicon substrate of the MEMS component.

6. The method as recited in claim 1, further comprising developing a plurality of openings in a center region of the interposer, the openings extending from the front side of the interposer to the rear side of the interposer.

7. The method as recited in claim 6, wherein the interposer is connected to the MEMS component so that the plurality of openings align with the MEMS structure to allow an environmental pressure to be exerted on the MEMS structure through the openings.

8. The method as recited in claim 1, wherein the MEMS component is a pressure sensor, and the MEMS structure includes a diaphragm positioned at least partially over a cavity.

9. The method as recited in claim 8, wherein the MEMS component further includes a plurality of piezo resistors formed on the diaphragm to convert a deflection of the diaphragm to an electrical signal.

10. The method as recited in claim 1, further comprising mounting the further component to a circuit board via a side of the further component substantially opposite a side of the further component to which the MEMS component is mounted via the interposer.

11. The method as recited in claim 1, wherein the further component is an integrated circuit configured to process signals generated by the MEMS component.

12. The method as recited in claim 1, wherein the interposer includes at least one of: glass, silicon, or a ceramic.

13. The method as recited in claim 1, wherein the metallic material includes copper.

14. The method as recited in claim 1, wherein the mechanical coupling of the interposer to the MEMS component occurs outside a region of the MEMS component occupied by the MEMS structure.

15. A method for manufacturing a vertically integrated assembly, the assembly including a MEMS component having a MEMS structure and a connection pad formed in a front side of a silicon substrate, the method comprising:
producing at least one contacting opening and at least one pressure opening in an interposer, the contacting and pressure openings extending from one side to another side of the interposer;
mechanically coupling the interposer to the MEMS component so that a space remains between the MEMS structure and the interposer, the contacting opening is aligned with the connection pad, and the pressure opening is aligned with the MEMS structure;
after mechanically coupling the interposer to the MEMS component, at least partially galvanically filling the contacting opening with a metallic material so that the metallic material grows on the connection pad; and
after galvanically filling the contacting opening, mounting the MEMS component via the interposer on a further component.

16. The method as recited in claim 15, wherein the MEMS structure includes a diaphragm, and the mechanical coupling aligns the pressure opening to the diaphragm so that an environmental pressure is exerted on the diaphragm through the opening.

17. The method as recited in claim 15, wherein the further component is an integrated circuit, and the mounting of the MEMS component to the further component provides an electrical connection between the MEMS component and the integrated circuit via the galvanically filled contact opening for transmitting signals generated by the MEMS component to the integrated circuit.

18. The method as recited in claim 15, further comprising mounting the further component to a circuit board via a side of the further component substantially opposite a side of the further component to which the MEMS component is mounted via the interposer.

19. The method as recited in claim 15, wherein the interposer includes at least one of: glass, silicon, or a ceramic.

\* \* \* \* \*